United States Patent
Spencer et al.

(10) Patent No.: US 7,157,979 B2
(45) Date of Patent: Jan. 2, 2007

(54) PHASE-LOCK LOOPS

(75) Inventors: Adrian G. Spencer, Horley (GB); Paul R. Marshall, Redhill (GB)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/526,197

(22) PCT Filed: Aug. 22, 2003

(86) PCT No.: PCT/IB03/03771

§ 371 (c)(1), (2), (4) Date: Mar. 1, 2005

(87) PCT Pub. No.: WO2004/023656

PCT Pub. Date: Mar. 18, 2004

(65) Prior Publication Data

US 2005/0250464 A1 Nov. 10, 2005

(30) Foreign Application Priority Data

Sep. 5, 2002 (GB) .................................. 0220616.7

(51) Int. Cl.
H03L 7/00 (2006.01)

(52) U.S. Cl. .......................... 331/16; 331/25; 331/175; 331/34; 331/177 R

(58) Field of Classification Search .................. 331/16, 331/25, 175, 177 R, 34
See application file for complete search history.

(56) References Cited

U.S. PATENT DOCUMENTS 6,292,507 B1 9/2001 Hardin et al.
6,404,292 B1 * 6/2002 Lautzenhiser ................ 331/17

* cited by examiner

*Primary Examiner*—Arnold Kinkead

(57) ABSTRACT

A phase lock loop comprises a variable frequency oscillator (20), a divider (30), a phase comparator (40), a gain control stage (240), and a loop filter (50). The frequency response of the loop is measured by superimposing a modulation at a number of different rates on the error signal generated by the phase comparator, and by measuring for each modulation rate the peak-to-peak variation of the loop control signal controlling the oscillator frequency. If, due to errors in component values, the frequency response deviates from its desired value, the loop gain is adjusted to bring the frequency response close to its desired value.

12 Claims, 5 Drawing Sheets

PHASE-LOCK LOOPS

The invention relates to apparatus including a phase-lock loop, for example an integrated circuit or a wireless receiver or transceiver which may be implemented in an integrated circuit.

Many types of apparatus include integrated electronic circuits. For integrating electronic circuits it is desirable to select an integration process that can offer benefits such as a low chip area, low voltage operation, low power consumption or a high operating frequency. However, some integration processes offer only a wide tolerance in passive component values such that the values of passive components (resistors, capacitors, inductors) vary widely from their desired values. A wide tolerance process, for example CMOS, may be acceptable for digital circuits but an analogue circuit implemented in such an integration process may not perform within a target specification, resulting in a low process yield. Therefore it is desirable to devise circuits that can operate with wide tolerance components.

Phase-lock loops are an important component in many electronic circuits. For example a phase-lock loop may be used to generate an oscillator signal for a wireless receiver, transmitter or transceiver. The following paragraphs contain a description of the principles of operation of a typical phase-lock loop (PLL) to assist understanding of the present invention.

Figure 1:
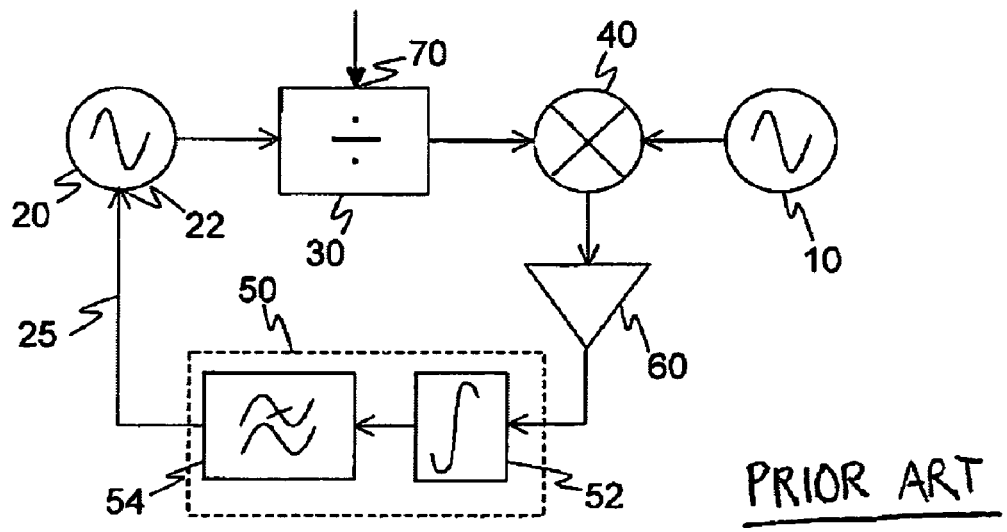

A typical prior art PLL is illustrated in FIG. 1. It comprises a source of a reference frequency 10 which generally employs a quartz crystal to generate a reference signal at a single, stable frequency $F_{ref}$ and a voltage controlled oscillator (VCO) 20 which oscillates at a multiple of the reference frequency. The multiple is determined by a divider 30. A phase comparator 40 compares the divided VCO output signal with the reference signal, generating a comparison signal indicative of the phase difference between these signals. A charge pump 60 and a loop filter 50 are used to convert this comparison signal to a loop control signal which is applied by coupling means 25 to a control input 22 for controlling the frequency of the VCO 20.

The charge pump 60 is a source or sink of current pulses, controlled by the comparison signal generated by the phase comparator 40. The loop filter 50 comprises an integrator 52 and a low pass filter 54. The integrator 52 is inherent in most practical loops due to the charge pump 60 output being coupled to a capacitor. The charge stored on the capacitor is increased or decreased by an amount proportional to the magnitude and time duration of each pulse of charge to/from the charge pump 60. These pulses are very short and of high amplitude so as to minimise noise injected into the loop. The loop filter 50 removes spurious signal components at the output of the phase comparator 40, such as the sum frequency at twice the reference frequency. It also reduces the low frequency noise in the loop which would otherwise result in 'close in' phase noise on the VCO output signal spectrum i.e. frequencies close to the desired VCO frequency.

When a PLL is used in circuits for wireless apparatus, commonly the division ratio of the divider 30 is programmable by means of a division control input 70 to enable selection from a number of radio channels. For example, if the reference frequency is 26 MHz, and the division ratio of the divider 30 is an integer, the VCO frequency may be changed in steps of 26 MHz. In applications where it is required to step the VCO frequency in steps smaller than the reference frequency a fractional division ratio is necessary. For example, the Bluetooth (registered trade mark) specification prescribes radio channels spaced at intervals of 1 MHz between 2400 MHz and 2480 MHz. A fractional division ratio is implemented by means of a division control signal applied to the division control input 70 to alternate the division between two or more division ratios to obtain a desired average division ratio. For example, if the frequency divider 30 has two division ratios, N and (N+1), and is set to divide by N for half the time, and (N+1) the other half, the average division ratio will be (N+0.5). The loop filter 50 ideally provides a perfect averaging function, so that the VCO output signal does not jitter between $N.F_{ref}$ and $(N+1).F_{ref}$ but is constant at $(N+0.5).F_{ref}$. The rate at which the division ratio is switched is restricted by the fact that the output of the divider 30 can change only at the reference frequency.

Figure 2:
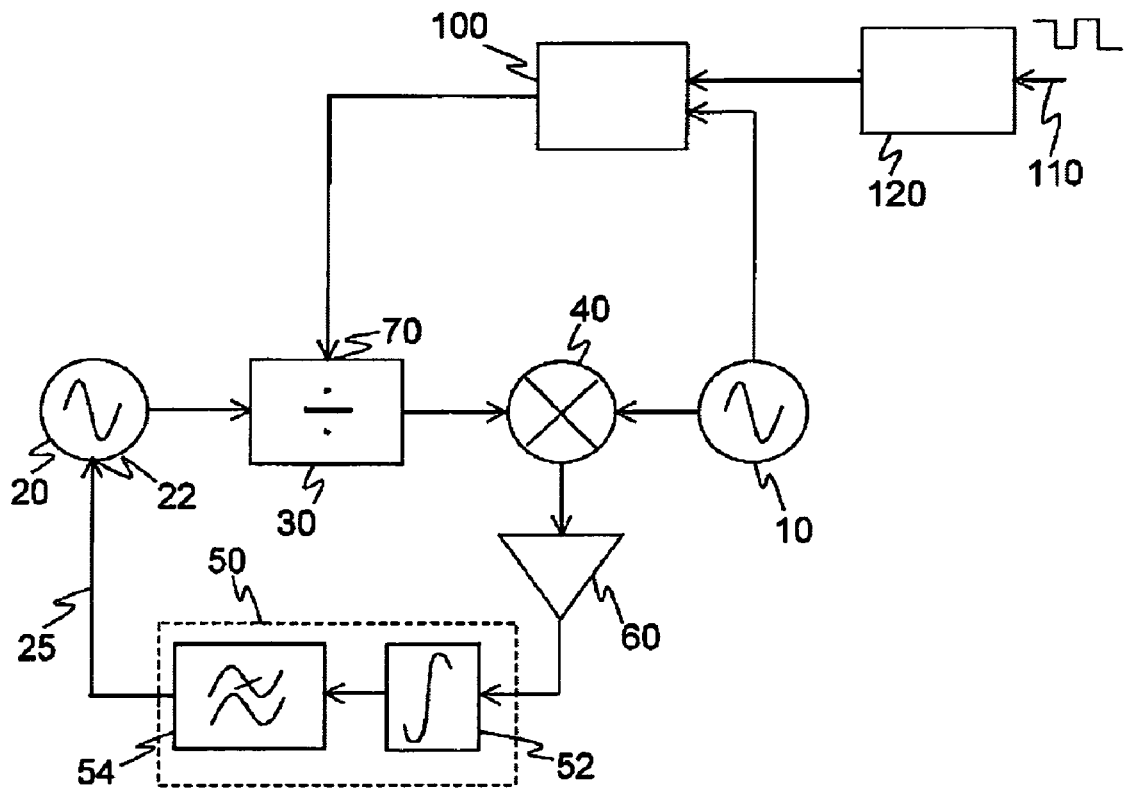
Figure 3:
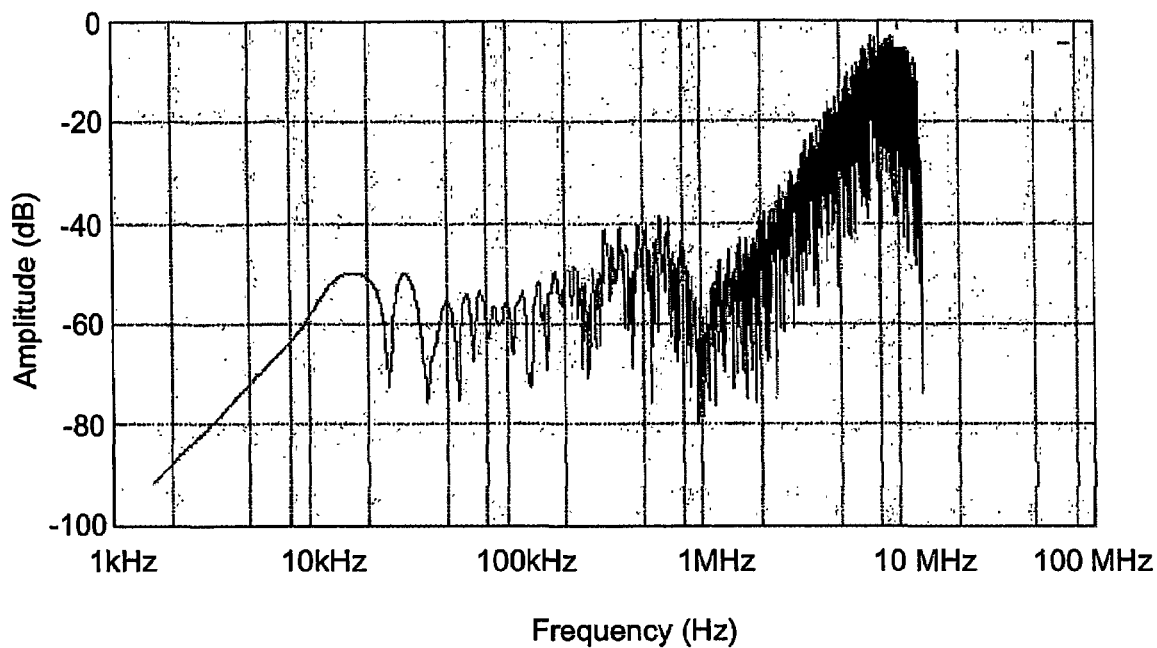

A result of rapidly changing the divider ratio is interference 'spurs' which are present in the spectrum of the VCO output signal. The loop filter 50 is unable to remove the close-in spurs but can attenuate higher-offset spurs. A sigma-delta modulator is commonly used to control the selection of division ratios in a pseudo-random manner which shapes the spurs so that the larger amplitude close-in spurs are moved to frequencies further removed from the desired VCO frequency where the loop filter can attenuate them. FIG. 2 illustrates a PLL including a sigma-delta modulator 100 coupled to derive a clock from the source 10 of reference frequency and coupled to the control input 70 of the divider 30 for the purpose of shaping the spurs. Elements in FIG. 2 denoted with reference numerals lower than 100 operate in an identical manner as described above in relation to FIG. 1. FIG. 3 is a graph of the single sided spectrum at the input to the loop filter 50 showing the low level of spurs at low frequency and high level at high frequency resulting from the use of the sigma-delta modulator 100. Overall, the result is that the spurs can be kept below a desired level at any frequency offset from the central output frequency.

The PLL architectures described above with reference to FIGS. 1 and 2 may be incorporated into a wireless receiver with the VCO generating a local oscillator signal for down-conversion of received signals. A PLL may also be modulated to generated a modulated signal for transmission by a wireless transmitter. In the case of Bluetooth, the required modulation is Gaussian Frequency-Shift Keying (GFSK), whereby the amplitude of the VCO is constant but the phase and frequency changes. Referring to FIG. 2, a bit-stream for transmission is supplied to an input 110 of a Gaussian filter 120, and the resulting filtered bit-stream is coupled to modulate the sigma delta modulator 100 which reduces the 'close-in' noise as described above. For half-duplex applications, such as Bluetooth, the PLL of FIG. 2 may be used alternately for transmit and receive modes.

If a PLL is implemented in a wide tolerance integration process the PLL may not perform adequately and may even be unstable. The frequency of oscillation of the VCO 20 and the VCO gain (that is the change of VCO frequency per unit change in input control voltage) may not be well defined. This causes the loop gain to be ill-defined and hence the loop filtering action to be similarly ill-defined. For a type 1 $2^{nd}$ order loop with unity feedback, the closed-loop transfer function is given by $$\frac{\frac{k}{\tau}}{s^2\tau + \frac{s}{\tau} + \frac{k}{\tau}}$$

where k is the loop gain, including the gain $K_v$ of the VCO 20 and any other gains in the loop, s is the Laplace operator, and τ is the time-constant of the loop filter 50. Equating s=jω, where ω is frequency, gives the amplitude response i.e. the amplitude of the loop frequency response, as $$\frac{\frac{k}{\tau}}{\left(\frac{K}{\tau} - \omega^2\right)^2 + \left(\frac{\omega}{\tau}\right)^2}.$$

Figure 8:
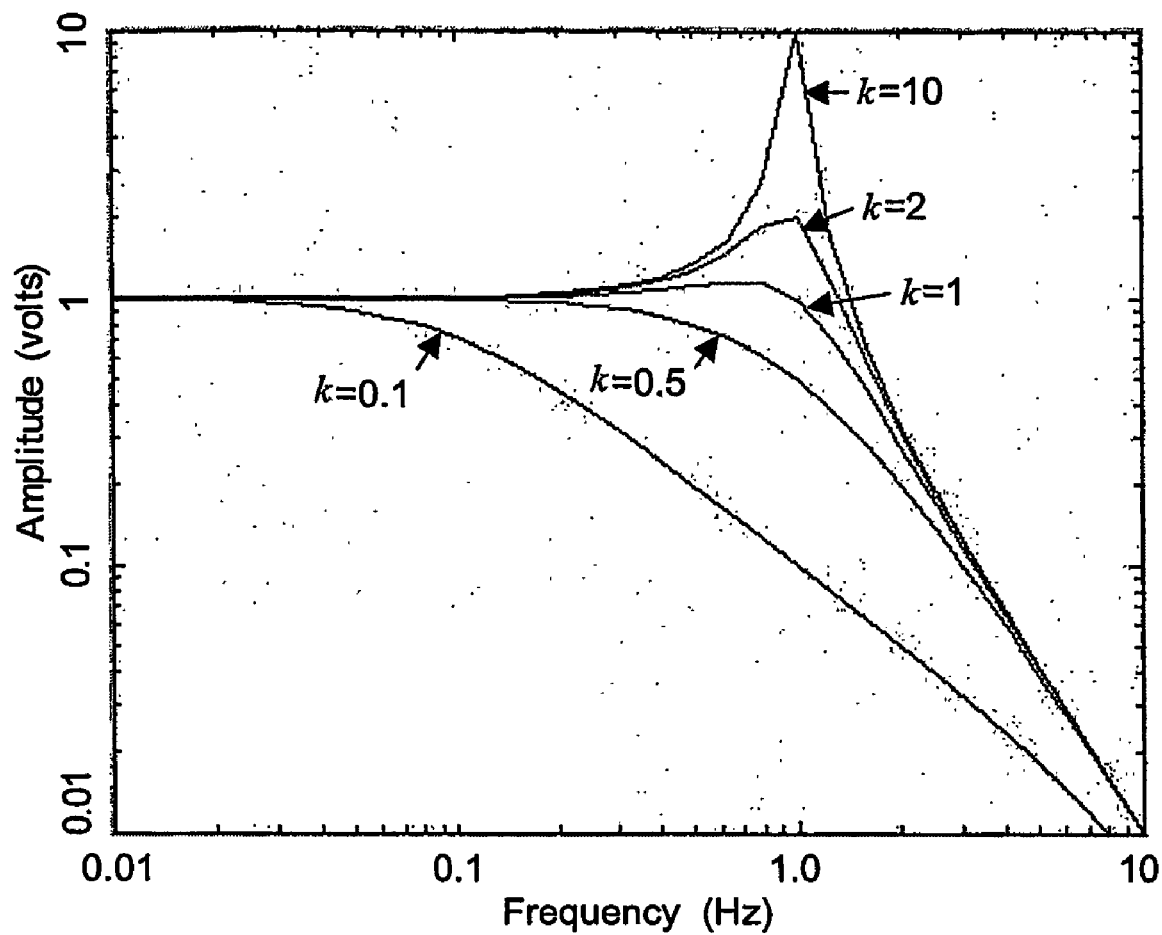

This amplitude response is plotted in FIG. 8 for several values of loop gain k from which it can be seen that the loop frequency response, and in particular the loop bandwidth and the peaking in the amplitude response, is dependent on the loop gain k, and that an ill-defined loop gain k can result in an ill-defined loop frequency response. The loop cut-off frequency i.e. the bandwidth where the amplitude is 3 dB below the low frequency value is given by:

$$\frac{w_n^2}{(w_n^2 - \omega_b^2)^2 + (4\xi^2 w_n^2 \omega_b^2)^2}$$

where $$w_n^2 = \frac{k}{\tau}$$

and the damping ratio is $$\xi = \frac{1}{2\omega_n \tau}.$$

An ill-defined loop frequency response can lead to two results. First, the loop cut-off frequency may be too high, leading to insufficient filtering resulting in spurious signal components in the loop, hence the VCO output being out of specification. Alternatively, the loop cut-off frequency may be too low, leading to unwanted filtering of the modulation. In the example case of a Bluetooth wireless transceiver, this can result in reduced transmission range or a higher bit-error rate.

It is desirable to devise phase-lock loops that can provide an acceptable performance with wide tolerance components in order to increase the benefit of circuit integration, for example enabling wide tolerance processes to be used for mixed mode (analogue and digital) integrated circuits.

An object of the present invention is to provide improvements in apparatus including a phase-lock loop and a method of calibrating a phase-lock loop.

According to a first aspect of the invention there is provided apparatus including a phase-lock loop, the phase-lock loop comprising an oscillator for generating a variable frequency signal and having a control input for controlling the frequency of the variable frequency signal, dividing means coupled to an output of the oscillator for dividing the variable frequency signal, phase comparator means coupled to an output of the dividing means for generating a comparison signal indicative of a phase difference between the divided variable frequency signal and a reference signal, filtering means coupled to an output of the phase comparator means for filtering the comparison signal, coupling means for coupling an output of the filtering means to the control input of the oscillator, further comprising modulation means for causing the comparison signal to be modulated at a plurality of rates, measurement means for measuring for each of the plurality of rates an indication of the peak-to-peak variation of a control signal applied to the control input of the oscillator, and adjustment means operable to adjust a loop gain in response to the measurements to obtain a predetermined loop frequency response.

According to a second aspect of the invention there is provided a method of calibrating a phase-lock loop including a variable frequency oscillator having a control input for controlling the frequency of the oscillator, a divider for dividing a signal generated by the variable frequency oscillator, a phase comparator for generating a comparison signal indicative of the phase difference between the divided signal and a reference signal, filtering means for filtering the comparison signal, and coupling means for coupling an output of the filtering means to the control input of the variable frequency oscillator, the method comprising modulating the comparison signal at a plurality of rates, measuring for each of the plurality of rates an indication of the peak-to-peak variation of a control signal applied to the control input of the variable frequency oscillator, and, in response to the measurements, adjusting a loop gain to obtain a predetermined loop frequency response.

The control signal applied to the control input of the variable frequency oscillator depends on the loop frequency response and on the rate at which the comparison signal is modulated. Therefore, measurements of the peak-to-peak variation, or an equivalent indication, of the control signal for each of a plurality of rates of modulating the comparison signal are indicative of the loop frequency response. Such an equivalent indication may be, for example, the peak-to-peak variation of the oscillator frequency or the peak-to-peak variation of the frequency of the divided signal.

The apparatus including the PLL may be, for example, a circuit module, an integrated circuit, or a wireless receiver, transmitter or transceiver.

Figure 5:
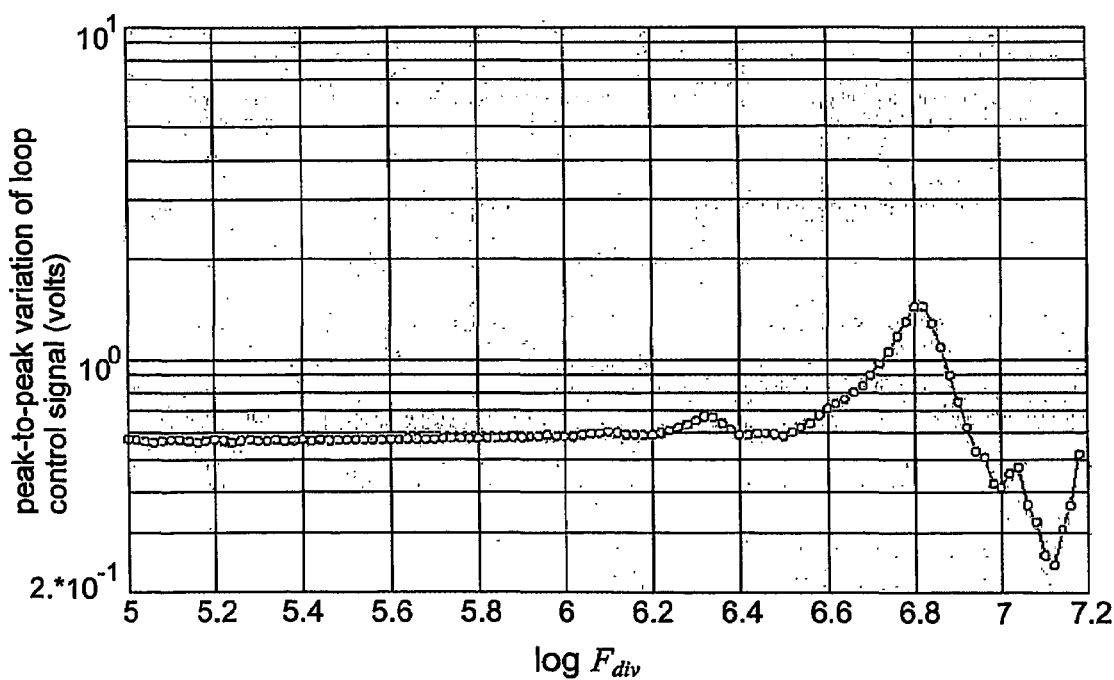
Figure 4:
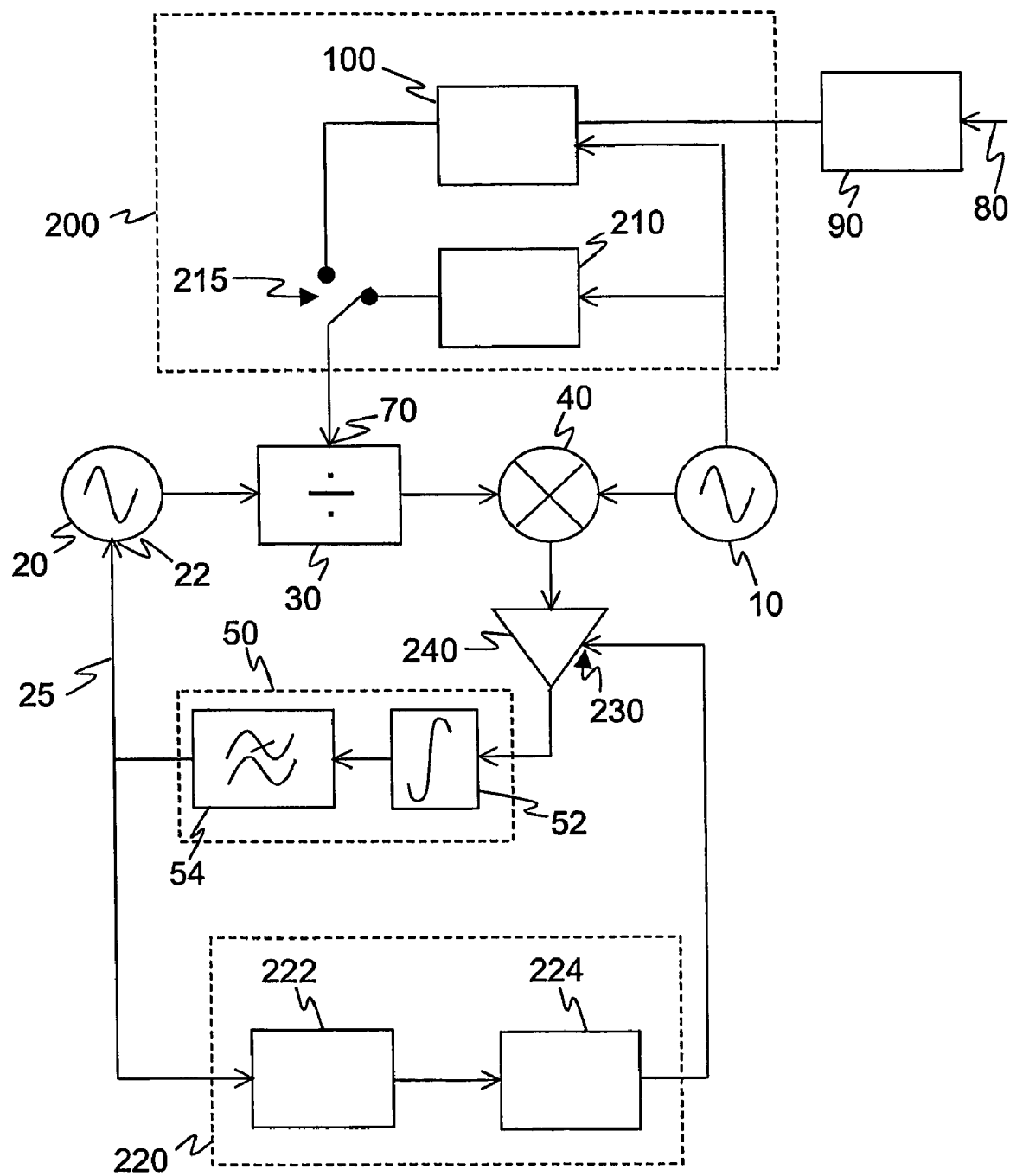
Figure 6:
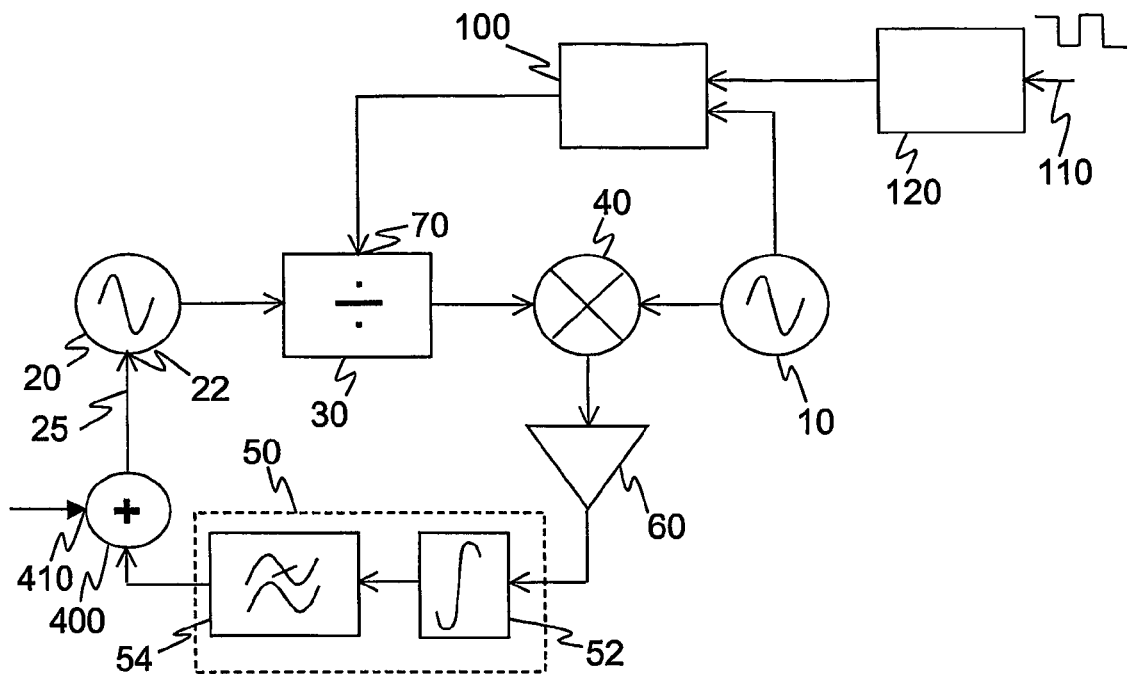
Figure 7:
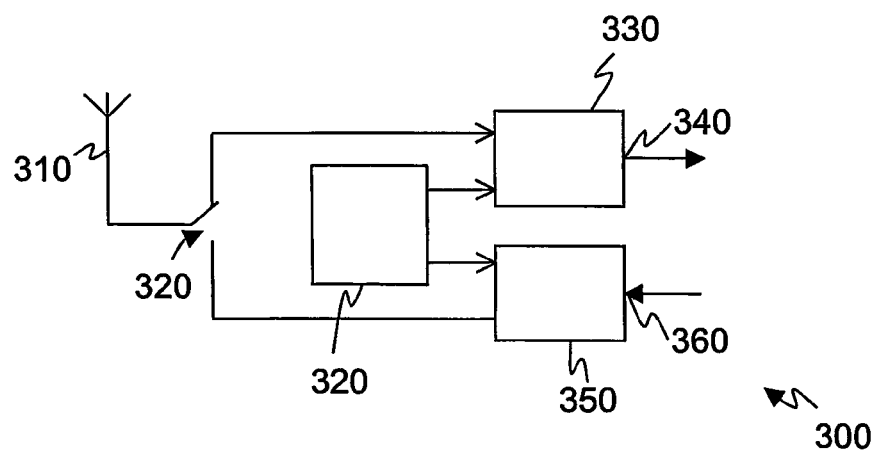

The invention will now be described, by way of example only, with reference to the accompanying drawings wherein:

FIG. 1 is a block schematic diagram of a prior art phase-lock loop,

FIG. 2 is a block schematic diagram of a prior art phase-lock loop with provision for changing division ratios in a pseudo-random manner and with provision for modulation, FIG. 3 is a graph of the spectrum of a signal at the input to the loop filter, FIG. 4 is a block schematic diagram of a phase-lock loop in accordance with the invention, FIG. 5 is a graph of the peak-to-peak variation of the loop control signal as a function of rate of varying the division ratio, FIG. 6 is a block schematic diagram of a phase-lock loop illustrating an alternative location for injecting modulation, FIG. 7 is a block schematic diagram of a wireless transceiver including a phase-lock loop, and FIG. 8 is a graph of loop frequency response for various values of loop gain k.

The basic operation of the PLL of FIG. 4 is similar to the PLL described above with reference to FIG. 2; only the differences will be described. Elements having the same reference numerals operate in the same manner. Referring to FIG. 4 there is a division control means 200 coupled to supply the division control input 70 of the divider 30. By means of a selector switch means 215, the division control means 200 can supply a division control signal from either the sigma-delta modulator 100, as described with reference to FIG. 2, or from a frequency generator 210. The frequency generator 210 is coupled to derive a clock from the source 10 of reference frequency. There is a measurement means 220 coupled to perform measurements on the loop control signal and coupled to supply, in response to the measurements, a charge pump control signal to a charge pump control input 230 of a charge pump 240. The charge pump 240 is the same as the charge pump 60 except for the additional provision for control of current pulse amplitude. Alternatively current pulse duration may be controlled. The measurement means 220 comprises an analogue-to-digital converter 222 for digitising the loop control signal and a processing means 224 for performing measurements on the digitised loop control signal and for generating the charge pump control signal. By means of the charge pump control signal, the magnitude of the current pulses supplied by the charge pump 240 to the loop filter 50 may be varied.

The PLL of FIG. 4 can adopt either of two modes. The first mode is a calibration mode in which the division control signal is supplied from the frequency generator 210 and the charge pump control signal is adjusted to obtain a desired loop frequency response, and the second mode corresponds to normal, in-service operation using the charge pump control signal determined in the first mode and in which the division control signal is supplied from the sigma-delta modulator 100. In-service operation has been described above with reference to FIG. 2, so only the calibration mode will be described below.

In the calibration mode, the frequency generator 210 produces a variable output frequency $F_{div}$ which controls the division ratio to be alternately N or (N+1) at a rate $F_{div}$. The frequency $F_{div}$ is set to a number of different values in turn, and for each value of $F_{div}$ the peak-to-peak variation of the loop control signal is measured by the measurement means 220. The resulting data, i.e. peak-to-peak variation of the loop control signal for each frequency $F_{div}$, indicates the measured frequency response of the loop. The processing means 224 compares the measured frequency response with a stored representation of the desired frequency response and if these do not match within an acceptable margin, adjusts the charge pump control signal to modify the loop gain k.

The following description explains the relationship between the frequency $F_{div}$ and the frequency response of the loop filter 50.

If the frequency $F_{div}$ is chosen to be high compared to the loop filter 50 cut-off frequency, the VCO output signal will tend to an average frequency of (N+0.5), assuming $F_{div}$ has a 50% duty cycle, because the loop filter 50 will remove the high frequency component of $F_{div}$. Hence the loop control signal will be constant at $F_{vco}/K_v$ where $F_{vco}$ is the frequency of the VCO output signal and is $(N+0.5).F_{ref}$ and $K_v$ is the gain of the VCO 20.

If the frequency $F_{div}$ is chosen to be a very low frequency, the VCO output signal will simply be alternately $N.F_{ref}$ for a period of time followed by $(N+1).F_{ref}$ for a period of time. In this case the loop control signal appearing at the input of the VCO 20 will be approximately a square wave because the loop filter 50, being a low pass filter, does not attenuate the very low frequency variations at the output of the phase comparator 40. The loop control signal square wave will alternate between values $F_{vco1}/K_v$ and $F_{vco2}/K_v$, where $F_{vco1}$ and $F_{vco2}$ are the frequencies that the VCO alternates between.

For frequencies of $F_{div}$ between these two extremes, the loop control signal will depend on the frequency response of the loop. By measuring the peak-to-peak variation of the loop control signal, the frequency response of the loop can be measured. In one simple embodiment, the peak-to-peak variation of the loop control signal may be measured by means of a rectifier and filter. An example of such a measured frequency response is illustrated in FIG. 5; the peaking in the frequency response is due to under-damping. By means of the charge pump control signal, the amplitude or duration of the current pulses in the charge pump 240 are adjusted, thereby adjusting loop gain, and the loop frequency response is measured again. The steps of measurement and adjustment are repeated iteratively until a predetermined, acceptable frequency response is obtained.

Having adjusted the charge pump control signal in the calibration mode, the value of the charge pump control signal is maintained during normal operation of the PLL to maintain the desired operation of the PLL. The calibration mode may be used at the time of manufacture of the apparatus including the PLL, and may be used also during the lifetime of the apparatus to re-calibrate the PLL in case of variation in component values, for example due to temperature changes.

Although the embodiment described above uses division ratios of N and (N+1), other division ratios may be used.

Optionally, the modulation for causing the comparison signal to be modulated at a plurality of rates may be injected into the PLL at alternative locations. For example, the source of reference frequency 10 may be modulated at a plurality of rates. As another example, referring to FIG. 6, the control signal applied to the control input 22 of the VCO 20 via the coupling means 25 may be a summation, formed in a summing means 400, of the filtered comparison signal and a modulation signal at a plurality of rates supplied at an input 410. These two alternative methods of modulation are applicable even when the divider 30 has a fixed division ratio.

Optionally, alternative ways of adjusting loop gain in response to the measurements may be employed. For example, the loop gain may be adjusted by adjusting the gain of a variable gain stage in the loop. Such a variable gain stage may be, for example, a variable gain amplifier or a variable gain VCO 20.

If the calibration is performed only at manufacture and not during in-service operation, the modulation means for causing the comparison signal to be modulated at a plurality of rates may be located wholly or partially external to the PLL.

Optionally, the loop gain may be determined for more than one set of division ratios, corresponding to different centre frequencies of the VCO 20. Such a plurality of values of loop gain may be determined and corresponding adjustment data stored for later recall during operation on any desired centre frequency. The use, in this way, of a plurality of values of loop gain can compensate for any variation in VCO gain over a range of operating frequencies, ensuring, for example, a uniform, maximum frequency deviation for a wireless transmitter throughout the operating range.

Referring to FIG. 7, there is illustrated a wireless transceiver 300 including a PLL. A transmitter 350 has an input 360 for data to be transmitted and is supplied with an oscillator signal from a PLL 320. In the transmitter 350 the oscillator signal is modulated by the data, amplified, and coupled to an antenna 310 by means of a transmit/receive change-over switch 320. A receiver 330 receives a signal from the antenna by means of the transmit/receive changeover switch 320, and is also supplied with a local oscillator signal from the PLL 320 for down converting the received signal. The receiver delivers received data on an output 340.

In the present specification and claims the word "a" or "an" preceding an element does not exclude the presence of a plurality of such elements. Further, the word "comprising" does not exclude the presence of other elements or steps than those listed.

From reading the present disclosure, other modifications will be apparent to persons skilled in the art. Such modifications may involve other features which are already known in the art of phase lock loops and apparatus including a phase lock loop and which may be used instead of or in addition to features already described herein.

The invention claimed is:

1. Apparatus including a phase-lock loop, the phase-lock loop comprising an oscillator (20) for generating a variable frequency signal and having a control input (22) for controlling the frequency of the variable frequency signal, dividing means (30) coupled to an output of the oscillator (20) for dividing the variable frequency signal, phase comparator means (40) coupled to an output of the dividing means (30) for generating a comparison signal indicative of a phase difference between the divided variable frequency signal and a reference signal, filtering means (50) coupled to an output of the phase comparator (40) means for filtering the comparison signal, coupling means (25) for coupling an output of the filtering means (50) to the control input (22) of the oscillator (20), further comprising modulation means (210 or 400, 410) for causing the comparison signal to be modulated at a plurality of rates, measurement means (220) for measuring for each of the plurality of rates an indication of the peak-to-peak variation of a control signal applied to the control input (22) of the oscillator (20), and adjustment means (230) operable to adjust a loop gain between the comparator means and the filter means in response to the measurements to obtain a predetermined loop frequency response.

2. Apparatus as claimed in claim 1, wherein the dividing means (30) has a variable division ratio and the modulation means (210 or 400, 410) for causing the comparison signal to be modulated at a plurality of rates comprises means (210 or 410) for modulating the variable division ratio at a plurality of rates.

3. Apparatus as claimed in claim 1, wherein the modulation means (210) for causing the comparison signal to be modulated at a plurality of rates comprises means (210) for modulating the frequency of the reference signal.

4. Apparatus as claimed in claim 1, wherein the modulation means (410, 400) for causing the comparison signal to be modulated at a plurality of rates comprises means (410, 400) for modulating the filtered comparison signal.

5. Apparatus as claimed in claim 1 wherein the phase comparator (40) comprises means (40) for generating pulses of current and the adjustment means (230) comprises means (230) for adjusting the amplitude or duration of the pulses of current.

6. Apparatus as claimed in claim 1, wherein the PLL further comprises a variable gain stage (20) and the adjustment means is operable to adjust the loop gain by varying the gain of the variable gain stage (20).

7. A method of calibrating a phase-lock loop including a variable frequency oscillator (20) having a control input (22) for controlling the frequency of the oscillator, a divider (30) for dividing a signal generated by the variable frequency oscillator, a phase comparator (40) for generating a comparison signal indicative of the phase difference between the divided signal and a reference signal, filtering means (50) for filtering the comparison signal, and coupling means (25) for coupling an output of the filtering means (50) to the control input (22) of the variable frequency oscillator (20), the method comprising modulating the comparison signal at a plurality of rates, measuring for each of the plurality of rates an indication of the peak-to-peak variation of a control signal applied to the control input of the variable frequency oscillator, and, in response to the measurements, adjusting a loop gain between the phase comparator and the filtering means to obtain a predetermined loop frequency response.

8. A method as claimed in claim 7, wherein the divider (30) has a variable division ratio and modulating the comparison signal comprises modulating the variable division ratio.

9. A method as claimed in claim 7, wherein modulating the comparison signal comprises modulating the frequency of the reference signal.

10. A method as claimed in claim 7, wherein modulating the comparison signal comprises modulating the filtered comparison signal.

11. A method as claimed in claim 7, wherein the phase comparator (40) comprises means for generating pulses of current and adjusting the loop gain comprises varying the amplitude or duration of the pulses.

12. A method as claimed in claim 7, wherein the PLL further comprises a variable gain stage (20) and adjusting the loop gain comprises varying the gain of the variable gain stage.

* * * * *